US010183861B2

(12) United States Patent
Breitling et al.

(10) Patent No.: US 10,183,861 B2
(45) Date of Patent: Jan. 22, 2019

(54) LASER RESEAL INCLUDING A PROTECTIVE STRUCTURE

(71) Applicant: Robert Bosch GmbH, Stuttgart (DE)

(72) Inventors: Achim Breitling, Reutlingen (DE); Frank Reichenbach, Wannweil (DE); Jochen Reinmuth, Reutlingen (DE); Julia Amthor, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 191 days.

(21) Appl. No.: 15/368,740

(22) Filed: Dec. 5, 2016

(65) Prior Publication Data
US 2017/0158497 A1 Jun. 8, 2017

(30) Foreign Application Priority Data
Dec. 8, 2015 (DE) .......................... 10 2015 224 482

(51) Int. Cl.

| H01L 21/00 | (2006.01) |
| B81C 1/00 | (2006.01) |
| B81B 7/04 | (2006.01) |
| G01C 19/5783 | (2012.01) |
| G01P 15/08 | (2006.01) |
| B81B 7/02 | (2006.01) |
| G01C 19/5769 | (2012.01) |

(52) U.S. Cl.
CPC ............ *B81C 1/00293* (2013.01); *B81B 7/02* (2013.01); *B81B 7/04* (2013.01); *G01C 19/5769* (2013.01); *G01C 19/5783* (2013.01); *G01P 15/0802* (2013.01); *B81B 2201/0235* (2013.01); *B81B 2201/0242* (2013.01); *B81B 2203/0315* (2013.01); *B81C 2203/0109* (2013.01); *B81C 2203/019* (2013.01); *B81C 2203/0145* (2013.01); *B81C 2203/0181* (2013.01)

(58) Field of Classification Search
CPC ......... B81B 7/04; B81B 7/02; G01C 19/5783; G01C 19/5769; B81C 1/00293
See application file for complete search history.

(56) References Cited

U.S. PATENT DOCUMENTS

2013/0075496 A1* 3/2013 Hart ...................... B05B 1/3033
239/428.5
2015/0368094 A1* 12/2015 Howard .............. B81C 1/00095
257/763

FOREIGN PATENT DOCUMENTS

WO 2015120939 A1 8/2015

* cited by examiner

*Primary Examiner* — Richard A Booth
(74) *Attorney, Agent, or Firm* — Norton Rose Fulbright US LLP; Gerard Messina

(57) ABSTRACT

A method for manufacturing a micromechanical component including a substrate and a cap connected to the substrate, the cap, together with the substrate, enclosing a first cavity, a first pressure prevailing and a first gas mixture having a first chemical composition being enclosed in the first cavity. An access opening connecting the first cavity to surroundings of the micromechanical component is formed in the substrate or in the cap. The first pressure and/or the first chemical composition is adjusted in the first cavity. The access opening is sealed by introducing energy or heat into an absorbing part of the substrate or of the cap with the aid of a laser. A layer for protecting the sealed access opening is applied to or deposited on or grown on a material area, which transitions into a liquid aggregate state and then transitions into a solid aggregate state and seals the access opening.

6 Claims, 3 Drawing Sheets

LASER RESEAL INCLUDING A PROTECTIVE STRUCTURE

CROSS REFERENCE

The present application claims the benefit under 35 U.S.C. § 119 of German Patent Application No. DE 102015224482.2 filed on Dec. 8, 2015, which is expressly incorporated herein by reference in its entirety.

BACKGROUND INFORMATION

A method is described in PCT Application No. WO 2015/120939 A1 in which, when a certain internal pressure is desired in a cavity of a micromechanical component or a gas mixture having a certain chemical composition is to be enclosed in the cavity, the internal pressure or the chemical composition is frequently adjusted during capping of the micromechanical component or during the bonding process between a substrate wafer and a cap wafer. During capping, for example, a cap is connected to a substrate, whereby the cap and the substrate together enclose the cavity. By adjusting the atmosphere or the pressure and/or the chemical composition of the gas mixture present in the surroundings during capping, it is thus possible to adjust the particular internal pressure and/or the particular chemical composition in the cavity.

With the aid of the method described in PCT Application No. WO 2015/120939 A1, an internal pressure may be adjusted in a targeted way in a cavity of a micromechanical component. It is in particular possible with the aid of this method to manufacture a micromechanical component having a first cavity, a first pressure and a first chemical composition being adjustable in the first cavity, which differ from a second pressure and a second chemical composition at the time of capping.

In the method for targeted adjusting of an internal pressure in a cavity of a micromechanical component according to PCT Application No. WO 2015/120939 A1, a narrow access channel to the cavity is created in the cap or in the cap wafer, or in the substrate or in the sensor wafer. Subsequently, the cavity is flooded with the desired gas and the desired internal pressure via the access channel. Finally, the area around the access channel is locally heated with the aid of a laser, the substrate material liquefies locally and hermetically seals the access channel during solidification.

SUMMARY

It is an object of the present invention to provide a method for manufacturing a micromechanical component which is mechanically robust and has a long service life compared to the related art, in a simple and cost-effective manner compared to the related art. It is a further object of the present invention to provide a micromechanical component which is compact, mechanically robust and has a long service life compared to the related art. According to the present invention, this applies, in particular, to a micromechanical component that includes one (first) cavity. With the aid of the method according to the present invention and the micromechanical component according to the present invention, it is furthermore also possible to implement a micromechanical component in which a first pressure and a first chemical composition may be adjusted in the first cavity, and a second pressure and a second chemical composition may be adjusted in a second cavity. For example, such a method for manufacturing micromechanical components is provided, for which it is advantageous if a first pressure is enclosed in a first cavity and a second pressure is enclosed in a second cavity, the first pressure being different from the second pressure. This is the case, for example, when a first sensor unit for rotation rate measurement and a second sensor unit for acceleration measurement are to be integrated into a micromechanical component.

The object may be achieved in accordance with example embodiments of the present invention by providing that in a fourth method step, a layer for protecting the sealed opening is applied to or deposited on or grown on a material area, which transitions into a liquid aggregate state in the third method step and which transitions into a solid aggregate state after the third method step and which seals the access opening. In this way, a method for manufacturing a micromechanical component is provided in a simple and cost-effective manner, with the aid of which the sealed opening is effectively protected. It is, in particular, possible with the aid of the present invention to protect a tip or a projecting overhang of the material area formed during solidification of the material due to the recrystallization dynamics, for example, in the center of the material area or in the center of the fused zone. Thus, for example, the likelihood of damage to the tip is reduced and unintentional contact with the tip is avoided during the further manufacturing flow, so that the material or the tip is less likely to be the cause and originating point of cracks.

In addition, it is less problematic with the layer or the protection of the material area offered by the layer if the substrate material is only heated locally, and the heated material contracts relative to its surroundings, both during solidification and during cooling. It is also less problematic that tensile stresses may develop in the sealing area. Furthermore, spontaneous crack formation as well as crack formation under thermal or mechanical load of the micromechanical component, which occurs as a function of the stress and the material during further processing or in the field, is also less likely.

Thus, a method for manufacturing a micromechanical component or an arrangement is provided, with which a seal of a channel is producible via local melting, the seal being effectively protectable, for example, both in the further processing of the micromechanical component, as well as in the field.

In connection with the present invention, the term "micromechanical component" is to be understood in that the term encompasses both micromechanical components and microelectromechanical components.

The present invention is preferably provided for the manufacture of a or for a micromechanical component having a cavity. However, the present invention is also provided, for example, for a micromechanical component having two cavities, or having more than two, i.e., three, four, five, six or more than six, cavities.

The access opening is preferably sealed by introducing energy or heat with the aid of a laser into a part of the substrate or of the cap which absorbs this energy or this heat. Energy or heat is preferably introduced chronologically in series into the respective absorbing part of the substrate or of the cap of multiple micromechanical components, which are manufactured together on a wafer, for example. However, alternatively, it is also possible to introduce the energy or heat simultaneously into the respective absorbing part of the substrate or of the cap of multiple micromechanical components, for example using multiple laser beams or laser devices.

Advantageous embodiments and refinements of the present invention may be derived from the description herein with reference to the figures.

According to one preferred refinement, it is provided that the cap, together with the substrate, encloses a second cavity, a second pressure prevailing and a second gas mixture having a second chemical composition being enclosed in the second cavity.

According to one preferred refinement, it is provided that in the fourth method step, the layer is at least partially applied, or deposited on or grown on a remaining area of the substrate or of the cap, which remains in a solid aggregate state in the third method step. This advantageously enables the layer to contribute to the hermetic seal of the access opening.

According to one preferred refinement, it is provided that the layer is conditioned in a fifth method step. This advantageously makes it possible for the stress condition of the layer to be changed after the layer is applied.

According to one preferred refinement, it is provided that in the fifth method step, the layer is conditioned in such a way that the layer generates a second mechanical stress, which counteracts a first mechanical stress occurring when the access opening is sealed. In this way, a method for manufacturing a micromechanical component is provided in a simple and cost effective manner, with which a second mechanical stress may be provided, which counteracts a first mechanical stress occurring when the access opening is sealed. Thus, it is possible, for example, with the aid of a compensation stress transmitted via the layer into the area of the access opening or via a boundary layer between the layer and the area of the access opening to reduce or at least partially compensate for a first mechanical stress present without the layer according to the present invention. Thus, for example, it is possible to reduce the tensile stress occurring in a solidified material area after the third method step and/or in the remaining substrate or in the remaining cap bordering on the solidified material area and/or at boundary surfaces between the solidified material area and the remaining substrate or the remaining cap. In addition, it is less problematic with the aid of the layer if the substrate material is only heated locally, and the heated material contracts relative to its surroundings, both during solidification and during cooling, since the first mechanical stress produced by the contraction during solidification and cooling may be counteracted with the aid of the layer and of the second mechanical stress produced by the layer, and the entire mechanical stress or stress distribution prevailing in the area of the access opening is reducible.

According to one preferred refinement, it is provided that in the fourth method step, the layer is applied to the material area and/or to the remaining area with the aid of a spin-on method or a spray-on method. It is also provided, for example, that the spin-on or sprayed-on layer is exposed and/or developed. Thus, it is advantageously made possible for liquid coatings and polyimides to be extensively applied to the material area or to the substrate or to the cap and subsequently to be selectively cured.

According to one preferred refinement, it is provided that in the fourth method step, the layer is applied with the aid of an inkjet method or a spray-jet method or a solder-jet method or a wire bonding method. This advantageously makes it possible for the layer to be applied only locally or, in particular, in the case of metallic layers, for the layer to be applied in liquid form to the material area or to the substrate or to the cap.

Additional subject matter of the present invention is a micromechanical component including a substrate and a cap which is connected to the substrate and, together with the substrate, encloses a first cavity, a first pressure prevailing and a first gas mixture having a first chemical composition being enclosed in the first cavity, the substrate or the cap including a sealed access opening, the micromechanical component including a layer for protecting the sealed access opening situated on a material area, which has transitioned into a liquid aggregate state when the access opening is sealed and which has transitioned into a solid aggregate state after the access opening is sealed and which seals the access opening. In this way, a compact, mechanically robust and cost-effective micromechanical component having an adjusted first pressure is advantageously provided. The above-mentioned advantages of the method according to the present invention apply correspondingly also to the micromechanical component according to the present invention.

According to one preferred refinement, it is provided that the layer is situated at least partially on a remaining area of the substrate or of the cap, which remains in the solid aggregate state when the access opening is sealed. This advantageously enables the layer to contribute to the hermetic seal of the access opening.

According to one preferred refinement, it is provided that the layer is softer than the material area and/or softer than the substrate and/or softer than the cap. According to one preferred refinement, it is provided, in particular, that the elastic modulus of the layers is less than the elastic modulus of the material layer and/or less than the elastic modulus of the substrate and/or less than the elastic modulus of the cap. This advantageously allows a particularly effective seal of the access opening to be provided.

According to one preferred refinement, it is provided that the cap, together with the substrate, encloses a second cavity, a second pressure prevailing and a second gas mixture having a second chemical composition being enclosed in the second cavity. In this way, a compact, mechanically robust and cost-effective micromechanical component having an adjusted first pressure and second pressure is advantageously provided.

According to one preferred refinement, it is provided that the first pressure is lower than the second pressure, a first sensor unit for rotation rate measurement being situated in the first cavity, and a second sensor unit for acceleration measurement being situated in the second cavity. In this way, a mechanically robust micromechanical component for rotation rate measurement and acceleration measurement, having optimal operating conditions for both the first sensor unit and the second sensor unit, is advantageously provided.

DETAILED DESCRIPTION OF EXAMPLE EMBODIMENTS

Figure 1:
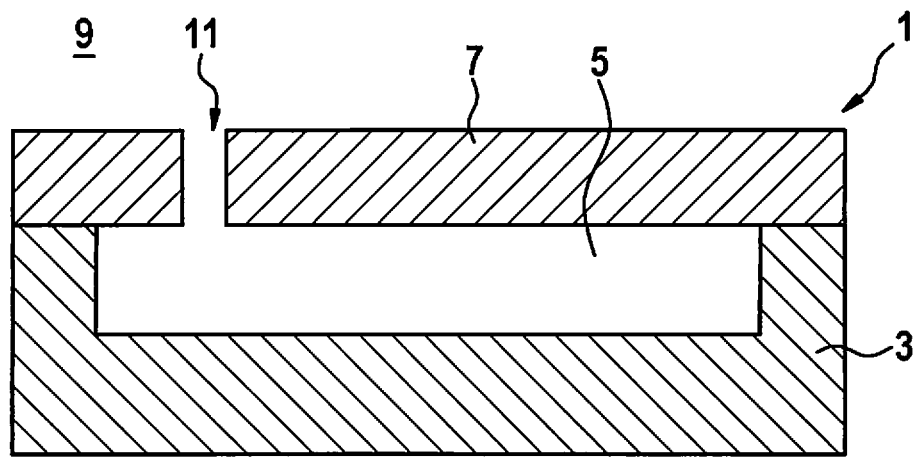
FIG. 1 shows a micromechanical component having an open access opening according to one exemplary specific embodiment of the present invention in a schematic representation.

Identical parts are denoted by the same reference numerals in the various figures and are therefore generally also cited or mentioned only once.

Figure 2:
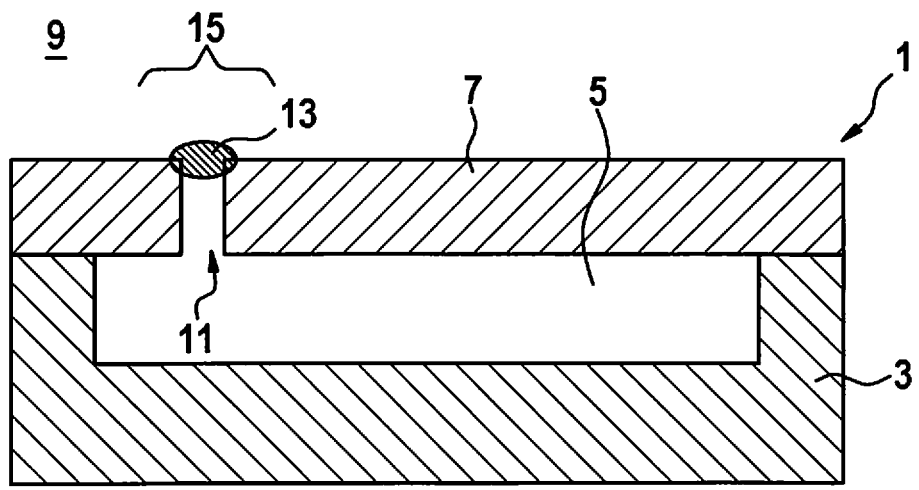
FIG. 2 shows the micromechanical component according to FIG. 1 having a sealed access opening in a schematic representation.

FIG. 1 and FIG. 2 show a schematic representation of a micromechanical component 1 having an open access opening 11 in FIG. 1, and having a sealed access opening 11 in FIG. 2, according to one exemplary specific embodiment of the present invention. Micromechanical component 1 includes a substrate 3 and a cap 7. Substrate 3 and cap 7 are, preferably hermetically, connected to one another and together enclose a first cavity 5. For example, micromechanical component 1 is designed in such a way that substrate 3 and cap 7 additionally together enclose a second cavity. The second cavity, however, is not shown in FIG. 1 and in FIG. 2.

For example, a first pressure prevails in first cavity 5, in particular when access opening 11 is sealed, as shown in FIG. 2. Moreover, a first gas mixture having a first chemical composition is enclosed in first cavity 5. In addition, for example, a second pressure prevails in the second cavity, and a second gas mixture having a second chemical composition is enclosed in the second cavity. Access opening 11 is preferably situated in substrate 3 or in cap 7. In the present exemplary embodiment, access opening 11 is situated in cap 7 by way of example. According to the present invention, however, it may also be alternatively provided that access opening 11 is situated in substrate 3.

It is provided, for example, that the first pressure in first cavity 5 is lower than the second pressure in the second cavity. It is also provided, for example, that a first micromechanical sensor unit for rotation rate measurement, which is not shown in FIG. 1 and FIG. 2, is situated in first cavity 5, and a second micromechanical sensor unit for acceleration measurement, which is not shown in FIG. 1 and FIG. 2, is situated in the second cavity.

Figure 3:
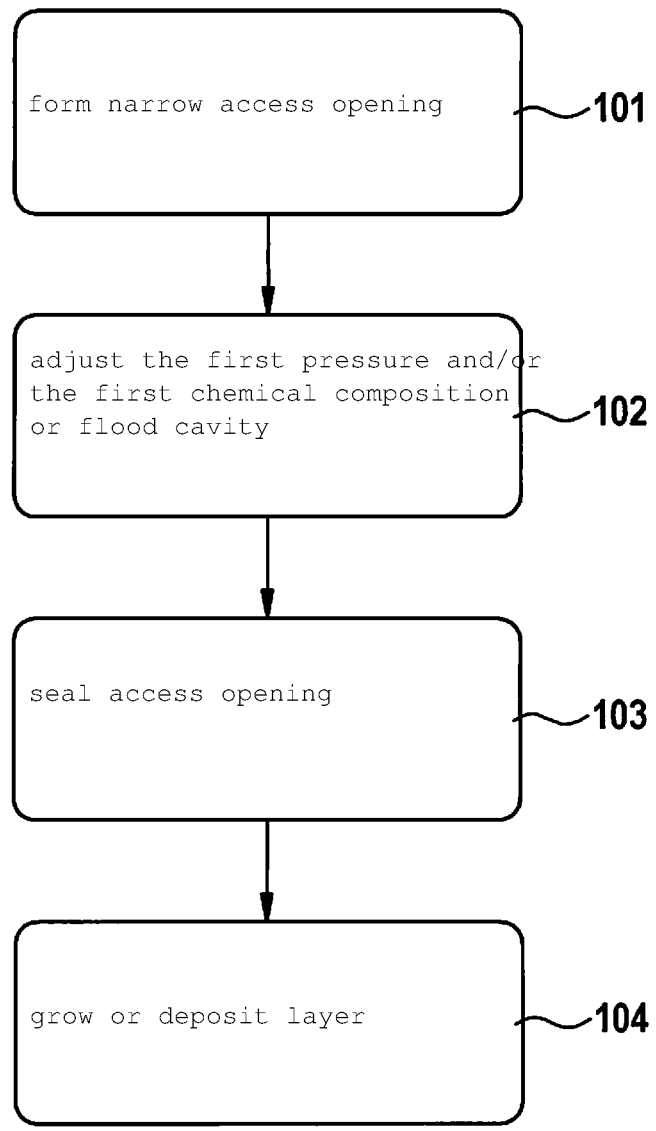
FIG. 3 shows a method for manufacturing a micromechanical component according to one exemplary specific embodiment of the present invention in a schematic representation.

FIG. 3 shows a method for manufacturing micromechanical component 1 according to one exemplary specific embodiment of the present invention in a schematic representation. In this method, in a first method step 101, in particular narrow access opening 11 connecting first cavity 5 to surroundings 9 of micromechanical component 1 is formed in substrate 3 or in cap 7. FIG. 1 shows micromechanical component 1 after first method step 101 by way of example. Moreover, in a second method step 102, the first pressure and/or the first chemical composition in first cavity 5 is adjusted, or first cavity 5 is flooded with the desired gas and the desired internal pressure via the access channel. Furthermore, for example, in a third method step 103, access opening 11 is sealed by introducing energy or heat with the aid of a laser into an absorbing part of substrate 3 or cap 7. Alternatively, for example, it is also provided that in third method step 103, the area around the access channel is preferably heated only locally by a laser, and the access channel is hermetically sealed. Thus, it is advantageously possible to also provide the method according to the present invention with energy sources other than with a laser for sealing access opening 11.

FIG. 2 shows micromechanical component 1 after third method step 103 by way of example.

Chronologically after third method step 103, it is possible for mechanical stresses to occur in a lateral area 15, shown by way of example in FIG. 2, on a surface facing away from cavity 5 of cap 7 and in the depth perpendicularly to a projection of lateral area 15 onto the surface, i.e., along access opening 11 and in the direction of first cavity 5 of micromechanical component 1. These mechanical stresses, in particular local mechanical stresses, prevail in particular on and in the vicinity of an interface between a material area 13 of cap 7, which in third method step 103 transitions into a liquid aggregate state and after third method step 103 transitions into a solid aggregate state and seals access opening 11, and a remaining area of cap 7, which remains in a solid aggregate state during third method step 103. In FIG. 2, material area 13 of cap 7 sealing access opening 11 is to be regarded only schematically or is shown only schematically, in particular with respect to its lateral extension or form, extending in particular in parallel to the surface, and in particular with respect to its expansion or configuration perpendicularly to the lateral extension, running in particular perpendicularly to the surface.

As shown in FIG. 3 by way of example, in a fourth method step 104, a layer for protecting sealed access opening 11 is also applied or deposited on or grown on material area 13, which transitions into a liquid aggregate state in third method step 103 and which transitions into a solid aggregate state after third method step 103 and which seals access opening 11. Fourth method step 104, for example, is carried out chronologically after third method step 103. It is also provided, for example, that in fourth method step 104, the layer is at least partially applied to, or deposited on or grown on a remaining area of substrate 3 or of cap 7, which remains in a solid aggregate state in third method step 103. In other words, a protective structure is applied to material area 13 and to the seal and in its surroundings. The protective structure in this case is applied, for example, only locally on the seal. In addition, it is provided, for example, that the protective structure is softer than the underlying material of the seal, in order to effectively protect this material.

In addition, it is provided, for example, that the applied protective structure produces or introduces tension or tensile stress on or in the material area or on or in the substrate or on or in the cap, in order to counteract the tendency to form cracks present in the seal or around the seal. Furthermore, it is provided, for example, that the protective layer in addition or alternatively also serves as a supplementary layer, which contributes to the hermetic seal of access opening 11. In the event the actual seal in the substrate becomes loose, the protective layer may continue to ensure the tightness of the entire structure.

Furthermore, it is provided, for example, that the layer or protective structure is extensively applied in fourth method step 104.

The extensive application occurs, for example, by applying the layer or structure locally in the area of the seal. In other words, in fourth method step 104, the layer is applied to material area 13 and/or on the remaining area with the aid of a spin-on method or a spray-on method. Methods such as the spinning on or spraying on of liquid coatings or polyimides, for example, are favorable in this case. With the aid of an exposure step and development step, the coatings or polyimides remain only on the areas of the seal structure.

The extensive application alternatively occurs, for example, by applying the layer only locally using inkjet methods or spray-jet methods. This is provided, in particular, when using expensive materials for the layer. In other words, the layer is applied in fourth method step 104 with the aid of an ink jet method or of a spray jet method or of a solder jet method or of a wire bonding method.

In addition, it is alternatively also provided that the layer is applied in a liquid form to the sealing area. This is provided, in particular, if metal protective structures are applied as a layer to the sealing area. In such case, it is provided, for example, that the layer is applied to the seal using a solder jet method. It is also provided, for example, that the layer is applied to the seal using a similar method, in which the material is applied in a liquid state.

Figure 4:
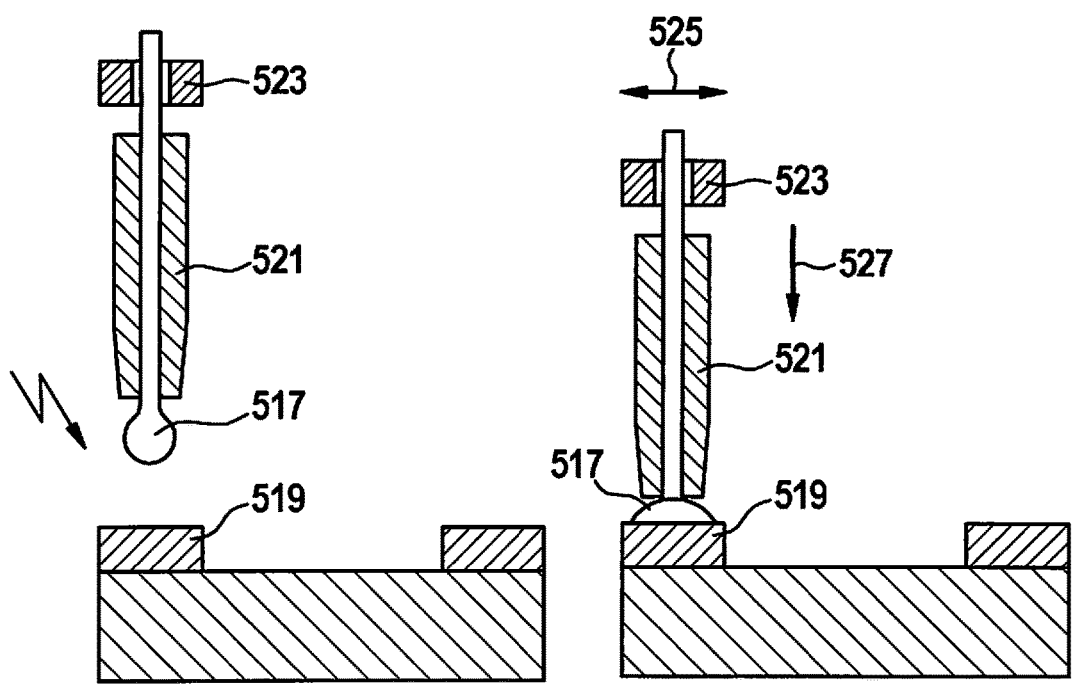
FIG. 4 shows a further exemplary specific embodiment of the present invention in a schematic representation.

Moreover, it is also provided, for example, that a ball bond is applied to or placed on the seal or on solidified material area 13 using a wire bonding method. In such case, it is provided, for example, that a metal ball, in particular, a gold ball is placed on the seal. This is shown by way of example in FIG. 4. The end of a gold wire 517, for example, is melted to a ball and the ball is applied to the seal or to and around solidified material area 13 under temperature and pressure using ultrasound 525. A bond pad 519, a capillary tube 521 and a clip 523 are shown, for example, in FIG. 4. Also shown are an ultrasound 525 or an ultrasonic excitation 525 and a bonding force 527. Here, it is provided, for example, that tensile stress is produced in the protective structure by a placement with pressure and with the subsequent loosening and removal of the gold wire. Alternatively or in addition, it is provided, for example, that during cooling of the substrate greater tensile stress is also produced, for example, in the protective structure, as a result of the different expansion coefficients between gold and silicon.

In addition, it is provided that the layer is conditioned in a fifth method step. The layer is conditioned in the fifth method step, for example, in such a way that the layer produces a second mechanical stress, which counteracts a first mechanical stress occurring when access opening 11 is sealed. In other words, the stressed state of the protective structure or the sealing structure is modified via a conditioning step or the fifth method step. In this step, tensile stress accumulates, in particular, in the protective structure relative to the underlying seal and substrate material. In such a case, it is provided, for example, that the tensile stress or a tension or a tension distribution is formed or acts only locally at the interface or at a boundary surface between the protective structure or layer and the seal/substrate or material area 13/substrate 3 or material area 13/cap 7 or in the protective structure. It is also provided, for example, that the tensile stress or tension relaxes toward the surface. It is provided alternatively or in addition, for example, that the tensile stress or the tension or tension distribution within the layer decreases from a side of the layer facing away from the first cavity toward a side of the layer facing the first cavity. It is also provided, for example, that as a result of the conditioning step, a local pressure stress accumulates at the interface or at the boundary surface in the seal/substrate 3 or seal/cap 7, such that the protective structure or layer senses a tensile stress or tension as a result, or such that a tension is transmitted from the seal or material area 13 or substrate 3 or cap 7 to the protective structure or layer.

In the fifth method step, for example, a shrinkage of the coating or of the polyimide layer is caused by vaporization of a solvent over time, pressure (vacuum) and temperature. In this way, tensile stress or tension, for example, is produced in the protective structure. It is provided, for example, that a vaporization of a solvent is produced in connection with an ink jet method or with any type of solvent-based spray method. It is provided, in particular, that the application of the layer and the conditioning of the layer are carried out simultaneously or in one method step. In other words, it is provided, for example, that fourth method step 104 and the fifth method step are carried out simultaneously. The choice of a suitable substrate temperature, in particular, may be important in such a case.

In addition, it is also provided, for example, that in the case of sequential methods, in particular, a cycle of initially applying the protective material and in the next step conditioning the protective material is carried out multiple times in succession. In other words, it is provided, for example, that fourth method step 104 and the fifth method step are carried out multiple times in succession. This advantageously makes it possible that, on the one hand, high stress values are achievable and, on the other hand, higher thicknesses of the protective structure are reproducible. It is provided, for example, that fourth method step 104 is initially carried out, the fifth method step being carried out subsequently, an additional layer being applied to or deposited on or grown on the layer in a sixth method step. It is also provided, for example, that the additional layer is conditioned in a seventh method step. It is also provided, for example, that a third layer is applied to or deposited on or grown on the additional layer in an eighth method step. It is also provided, for example, that the third layer is conditioned in a ninth method step.

Furthermore, it is provided, for example, that in fourth method step 104, for example, a liquid metal is applied to the seal as a protective structure. In this case, it is provided, for example, that substrate 3 or cap 7 are maintained at a lower temperature than the metal. It is provided, for example, that substrate 3 or cap 7 includes silicon. It is advantageous when using silicon as a substrate material, for example, that silicon has a lower thermal expansion coefficient than most metals. Thus, it may be provided that only the metal is cooled in the fifth method step. In such case, the metal contracts, for example, and produces tensile stress in the protective structure, both because of the different temperature as well as the different expansion coefficient.

What is claimed is:

1. A method for manufacturing a micromechanical component including a substrate and a cap connected to the substrate, the cap, together with the substrate, enclosing a first cavity, a first pressure prevailing and a first gas mixture having a first chemical composition being enclosed in the first cavity, the method comprising:

in a first method step, forming in the substrate or the cap an access opening connecting the first cavity to surroundings of the micromechanical component;

in a second method step, adjusting in the first cavity at least one of the first pressure and the first chemical composition;

in a third method step, sealing the access opening (by introducing energy or heat into an absorbing part of the substrate or the cap, with the aid of a laser; and in a fourth method step, applying, depositing or growing a layer for protecting the sealed access opening on a material area, which transitions into a liquid aggregate state in the third method step and transitions into a solid aggregate state after the third method step and which seals the access opening.

2. The method as recited in claim 1, wherein in the fourth method step, the layer is applied, deposited, or grown at least partially on a remaining area of the substrate or of the cap, which remains in a solid aggregate state in the third method step.

3. The method as recited in claim 1, further comprising:
in a fifth method step, conditioning the layer.

4. The method as recited in claim 3, wherein the layer is conditioned in the fifth method step in such a way that the layer produces a second mechanical stress, which counteracts a first mechanical stress occurring when the access opening is sealed.

5. The method as recited in claim 2, wherein in the fourth method step, the layer is applied at least one of to the material area and to the remaining area, with the aid of a spin-on method or a spray-on method.

6. The method as recited in claim 1, wherein in the fourth method step, the layer is applied with the aid of one of an ink jet method, a spray jet method, a solder jet method, or a wire bonding method.

\* \* \* \* \*